United States Patent [19]

Sands

[11] Patent Number: 5,262,347
[45] Date of Patent: Nov. 16, 1993

[54] PALLADIUM WELDING OF A SEMICONDUCTOR BODY

[75] Inventor: Timothy D. Sands, Cranbury, N.J.

[73] Assignee: Bell Communications Research, Inc., Livingston, N.J.

[21] Appl. No.: 744,983

[22] Filed: Aug. 14, 1991

[51] Int. Cl.$^5$ .............................................. H01C 21/84
[52] U.S. Cl. ...................................... 437/86; 437/245; 437/966; 148/DIG. 12; 148/DIG. 135; 228/123.1; 228/903; 228/208; 228/262.61
[58] Field of Search .................... 437/62, 84, 974, 245, 437/966, 86; 148/DIG. 12, DIG. 135; 228/123, 263.11, 263.12, 208, 209, 210

[56] References Cited

U.S. PATENT DOCUMENTS

| | | | |
|---|---|---|---|
| 3,769,688 | 11/1973 | Kessler, Jr. et al. | 437/221 |
| 3,839,727 | 10/1974 | Herdzik et al. | 437/201 |
| 4,027,326 | 5/1977 | Kummer et al. | 228/123 |
| 4,826,787 | 5/1989 | Muto et al. | |
| 4,846,931 | 7/1989 | Gmitter et al. | 156/633 |
| 4,883,561 | 11/1989 | Gmitter et al. | 156/633 |
| 5,048,744 | 9/1991 | Chang et al. | 228/123 |

OTHER PUBLICATIONS

Ghandhi, S., *VLSI Fabrication Principles*, John Wiley & Sons, ©1983 pp. 436–437.

Haisma, J., "Silicon On Insulator Wafer Bonding-Wafer Thinning Technological Evaluations" Japanese J. Appl. Phys. vol. 28, No. 8, Aug. (1989) pp. 1426–1443.

K. N. Tu et al, "Silicide Formation", *Thin Films–Interdiffusion and Reactions*, 1978, John Wiley & Sons: New York, pp. 376 and 380.

T. Sands et al, "Ni, Pd, and Pt on GaAs: A comparative study of interfacial structures, compositions, and reacted film morphologies," Journal of Materials Research, 1987, vol. 2, pp. 262–275.

R. Caron-Popowich et al, "Phase formation in the Pd–InP system," *Journal of Applied Physics*, 1988, vol. 64, pp. 4909–4913.

Primary Examiner—George Fourson
Attorney, Agent, or Firm—Leonard Charles Suchyta; Charles S. Guenzer

[57] ABSTRACT

A method of bonding together two dissimilar planar bodies, one of which is a semiconductor. A film of palladium is deposited on one of the bodies. The two bodies are pressed together with moderate force with the palladium in between. The palladium chemically reacts with the semiconductor and, at least in the case of GaAs, dissolves the surface oxide and forms a crystalline palladium/semiconductor product topotaxial with the semiconductor.

12 Claims, 2 Drawing Sheets

PALLADIUM WELDING OF A SEMICONDUCTOR BODY

GOVERNMENT RIGHTS

This invention was made partially with Government support under Contract N0014-90-C-0048 awarded by the Department of the Navy. The government has certain rights in this invention.

FIELD OF THE INVENTION

The invention relates generally to semiconductor structures; in particular, the invention relates to the fabrication of a hybrid structure of a semiconductor material bonded to a dissimilar material.

BACKGROUND ART

Hybrid structures have been sought for electronic and opto-electronic integrated circuits in which different portions of the circuit are composed of different materials, each having advantageous properties for the function performed in that portion. For example, GaAs offers very high speed electronic operation and opto-electronic properties in a useful wavelength range. However, GaAs integrated-circuit technology lags significantly behind that for Si. Furthermore, GaAs substrates are substantially more expensive than Si substrates. Hence, a hybrid would be desirable having a small GaAs portion, devoted to very high-speed operation or optical functions, somehow formed on a Si substrate also including a complex Si integrated circuit portion. Such a hybrid is even more desirable for InP or InGaAs opto-electronic circuits useful in the infrared spectrum because of the relative immaturity of the InP technology.

Except in a few special cases of lattice-matched materials, direct epitaxial growth of a first material on a substrate of a second material results in a hetero-epitaxial layer of the first material having much poorer structural, optical, and electrical properties than if the epilayer were grown on a substrate of the same material. For example, GaAs directly grown on a Si substrate contains at least $10^6$ dislocations per square centimeter because of the 4% lattice mismatch and the large difference in thermal expansion coefficients between the two materials. Elaborate techniques can somewhat reduce the defect level, but lasers and minority-carrier devices built in such heteroepitaxial structures have demonstrated poor quality and limited lifetimes.

Several techniques exist to fusion bond a semiconductor material to another material. These have involved high pressure, high temperature, or an oxide-reducing atmosphere. If a semiconducting thin film is desired, it has been typical to bond a semiconducting wafer to the other material and then thin the wafer down to thin-film thickness.

Gmitter et al. have disclosed an epitaxial lift-off and bonding procedure in U.S. Pat. Nos. 4,846,931 and 4,883,561. They first produce a free-standing thin film of GaAs or similar material by selective etching of an underlying AlAs layer. This thin film is then bonded to an almost arbitrary substrate by Van der Waals force. The flexibility of the thin film allowed its bonding to the locally varying topography of a typical substrate. However, the Van der Waals bonding has not been as robust as desired, and the bonded films have shown a tendency to peel away from the substrate under severe conditions, such as later high-temperature processing. A Van der Waals bond is inherently weaker than a chemical bond. Cross-section micrographs of the Van der Waals bond have shown that the bonding layer consists of 2 to 10 nm of native oxide of the semiconductor. Furthermore, the bonding has necessarily involved the planar bonding of an entire thin-film segment to the substrate.

Palladium is known to form good ohmic contacts with heavily doped GaAs by dispersing the GaAs oxide and reacting with the GaAs, as described, for example, by Lau et al. in U.S. Pat. No. 5,045,502. However, the palladium-based ohmic contact is then overlaid with a metal lead. As a result, the metal lead is deposited as a thin film on the palladium and is not bonded to it as a free-standing body.

SUMMARY OF THE INVENTION

Accordingly, an object of the invention is to provide a bond between two dissimilar materials that is robust, thermally conductive, and can be formed with simple fabrication techniques.

The invention can be summarized as a heterostructure and its method of forming in which a semiconductor body is bonded with a palladium weld to another body of a dissimilar material. The palladium disperses the oxide on the semiconductor and reacts with the semiconductor, typically forming a continuously crystalline bonding region.

DETAILED DESCRIPTION OF THE PREFERRED EMBODIMENTS

Figure 1:
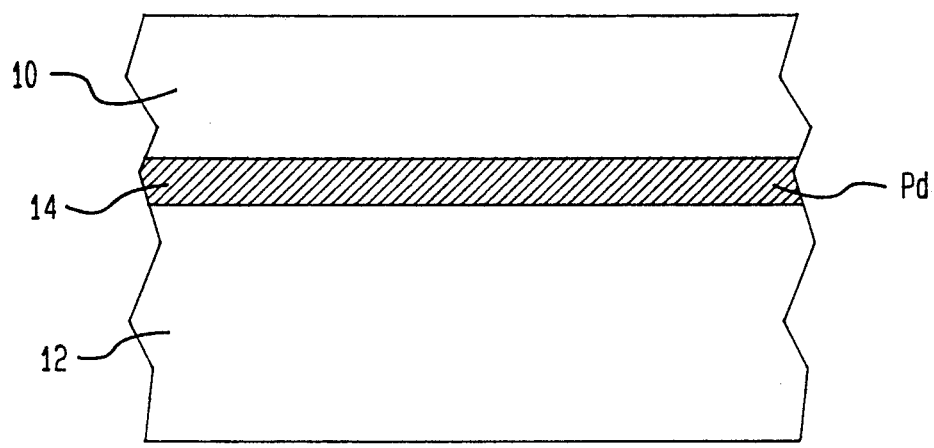
FIG. 1 is a cross-sectional view of an embodiment of the invention.

As illustrated in the cross-sectional view of FIG. 1, a free-standing semiconductor body 10 can be bonded to a substrate 12 by a intermediate palladium thin film 14. The bonding between the semiconductor and the palladium is so intimate that it can be referred to as welding.

Palladium has special advantages for the bonding agent. It will displace native oxide layers on the semiconductor, but it itself resists oxidation. It is the only metal which reacts readily at low temperatures of 200° C. or less with both elemental semiconductors, e.g., Si and Ge, and compound semiconductors, e.g., the III-V semiconductor families based on GaAs and InP. The reactivity of Pd with Si is discussed by Tu et al. in a chapter "Silicide Formation," in *Thin Films-Interdiffusion and Reactions*, eds. Poate et al., John Wiley & Sons, 1978, pp. 376 and 380. The reactivity with GaAs and InP is discussed by Sands et al. in "Ni, Pd and Pt on GaAs: A comparative study of interfacial structures, compositions, and reacted film morphologies," *Journal of Materials Research*, volume 2, 1987, pp. 262-275 and by Caron-Popowich et al. in "Phase formation in the Pd-InP system," *Journal of Applied Physics*, volume 64, 1988, pp. 4909-4913. In view of the reactivity, the semiconductor is chemically bonded to the palladium by a solid-phase reaction, and the palladium thereby acts as a welding agent to the semiconductor. The surface diffusivity of palladium atoms on a palladium surface is very high, allowing for significant mass transport at temperatures as low as 200° C., far below 600° C. at which some technologically important semiconductors begin to react. Such transport can fill in crevices or irregularities which inevitably occur on wafers. Furthermore, palladium layers are compatible with semiconductors up to temperatures of about 600° C., and they can accommodate thermal stresses by plastic deformation of the metal. Thereby, the bonded semiconductor layer can thereafter be subjected to many standard semiconductor processing steps.

The semiconductor body 10 may thus be any elemental or compound semiconductor. It may be in the form of a relatively thick (0.1 mm or more) wafer or a die cut from a wafer or in the form of a thin film. A thin film is usually formed by some type of deposition method and usually has a thickness of 10 μm or less. Although deposition of semiconducting thin films is well known, they cannot be deposited in singly crystalline form on polycrystalline palladium. Furthermore, the semiconductor body 10 that is welded to the palladium is free-standing prior to welding. That is, it exists as a separate body apart from the palladium prior to the welding.

The Pd layer 14 may be relatively thick or may be deposited to thickness of less than a micrometer by semiconductor deposition techniques. Furthermore, the Pd layer 14 may be patterned to form interconnects or vias for electrical connection or heat transfer. A patterned Pd layer 14 offers the further advantage of more easily accommodating particulates in the unbonded areas.

The substrate 12 may be of almost any material to which palladium will adhere. If palladium would not directly adhere to the bulk material, a buffer layer may be deposited that itself adheres to the bulk material and to which the palladium adheres. That is, the bulk substrate 12 may be an elemental or compound semiconductor, a metal, an insulator, or a glassy material.

Figure 2:
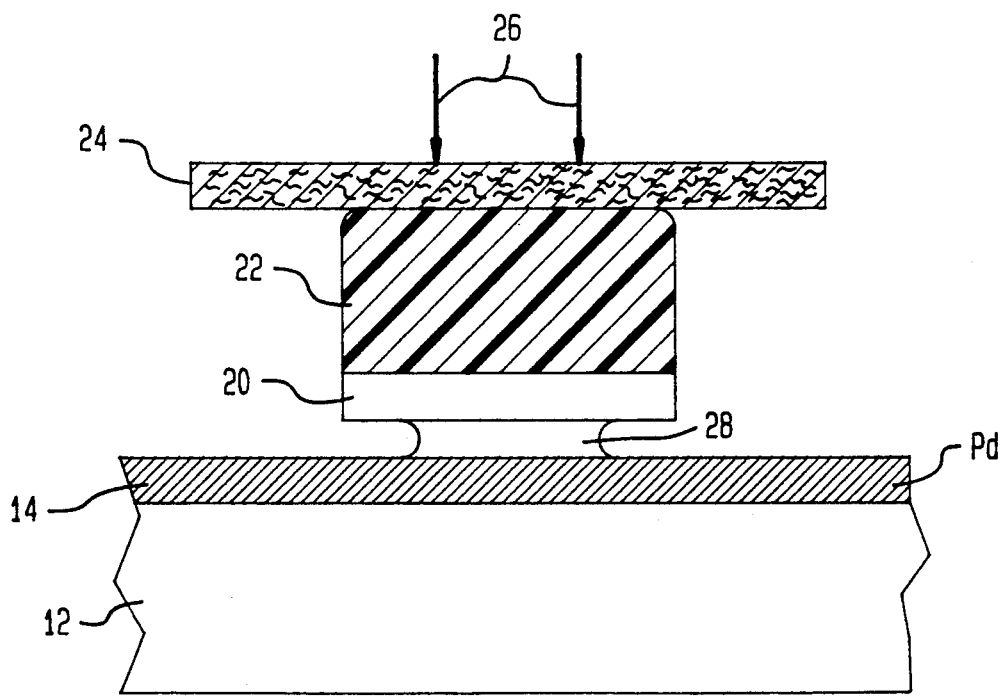
FIG. 2 is a cross-sectional view illustrating a method of practicing the invention by bonding a thin film to a foreign substrate.

A general technique has been developed for welding GaAs or $Ga_{1-x}Al_xAs$ ($x<0.4$) thin films to nearly arbitrary substrates. The thin films are produced by the epitaxial lift-off method described in the Gmitter et al. patents using an AlAs release layer between the thin film and the GaAs substrate on which it is grown. As illustrated in cross section in FIG. 2, a GaAs-based thin film 20 to be lifted off its native substrate is coated with a wax 22 having the trade name Apiezon W. The thin film 20 is lifted off its native GaAs substrate by dissolving the intermediate AlAs release layer with dilute HF acid. The lift-off can occur in a sealed beaker in a refrigerator held at 0° C. After lift-off, the acid in the beaker is displaced by de-ionized water, and the foreign substrate 12 together with the Pd layer 14 is placed in the beaker. A vacuum tool manipulates the thin film 20 and associated wax 22 onto the Pd layer 14 in the aqueous environment in which the thin film was initially released. Thereby, dust contamination at the initially formed interface is minimized. The bulk of the water is then drained away, and the partially bonded structure is placed in a press with a pad of tissue paper 24 placed on top of the wax 22. A pressure 26 of no more than 15,000 dynes per square millimeter is applied so as to not deform the supporting wax 22. The pressure 26 is applied for a drying period extending overnight so as to allow remaining water 28 to evaporate and the thin film 20 to come into intimate contact with the Pd layer 14 and to be bonded thereto. Thereafter, the wax 22 is dissolved with trichloroethylene. With the exception of the Pd layer 14, the above procedure is a standardized Van der Waals bonding procedure. The GaAs-based thin film 20 may then be annealed at 200° C. to react with the palladium layer 14. However, it has been found that annealing at room temperature for a few days very adequately bonds the thin film 20 to the Pd layer 14. The thin film 20 is thus welded to the substrate 12 or at least to the Pd layer 14 and is ready for further processing.

EXAMPLE 1

The above procedure was demonstrated with a $p^+$-GaAs thin film, doped $p \approx 2 \times 10^{19}$ cm$^{-3}$. The film was grown to a thickness of 1 μm on a 50 nm release layer of AlAs over a GaAs substrate. While the thin film was still attached to the GaAs substrate, it was coated with 250 nm of a standard ohmic Au-Zn-Cr metallization, and the metallization was photolithographically patterned into individual contact dots of varying diameters. A rapid thermal annealer then alloyed the metallization at 425° C. Thereafter, the wax was applied over the patterned metallization, and the thin-film and its metallization were lifted off the GaAs substrate.

The target substrate was a silicon wafer which had been coated with 50 nm of gold and then 60 nm of palladium. The lifted-off thin film was bonded to the Pd-coated substrate by the above procedure with the patterned metallization on the free surface of the bonded thin film. An anneal at 200° C. for about 30 minutes completed the metallurgical bonding or welding.

After welding, the metallization contact pads were used as etching masks. A wet etchant removed the exposed portions of the GaAs thin film, and the Pd layer served as an etch stop. Individual GaAs dots together with their attached metallizations were thereby isolated.

Resistance was then measured between point contacts touching two different Au-Zn-Cr metallization pads. The current had to flow through the two point contacts, two $p^+$-GaAs dots, two GaAs/Pd interfaces, and laterally through the connecting Pd film or underlying silicon. The resistances were determined to be $1.5 \pm 0.1\Omega$, most of which can be attributed to contributions other than the GaAs/Pd interface. An upper limit for the contact resistance may be placed at $10^{-4}$ Ω·cm$^2$.

The bonded structure survived the Scotch-tape test, thereby demonstrating the robustness of the chemical bonding.

The welded film and substrate were also cross-sectioned and examined by transmission electron microscopy (TEM) which displays atomically sharp structures. TEM showed that the palladium reacted with the GaAs to form a crystalline compound Pd$_x$GaAs, where $x \approx 4$. This crystalline structure is hexagonal and isostructural with Pd$_2$Si. TEM showed the Pd$_4$GaAs to be continuous with the GaAs so that it is topotaxially formed on the GaAs by the Pd reacting with the GaAs. The interfacial native oxide appears to be displaced into Kirkendall voids forming about 20 nm below the GaAs/Pd$_4$GaAs interface.

EXAMPLE 2

Very similar electrical results were obtained on heavily doped $n^+$-GaAs films produced by epitaxial lift-off.

Figure 3:
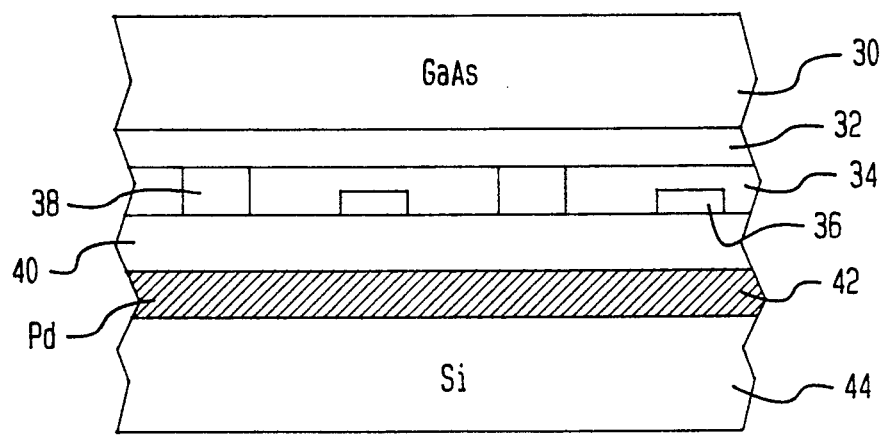
FIG. 3 is a cross-sectional view of a second embodiment of the invention.

Although the above examples bonded a free-standing thin film to a foreign substrate, the invention can be used to weld together two substrates of wafer thicknesses. For example, as illustrated in cross section in FIG. 3, a hybrid of GaAs and Si may be formed as follows. An etch-stop layer 32, such as AlAs is epitaxially deposited on a GaAs substrate 30. A circuit layer 34 is epitaxially deposited on the etch-stop layer 32 and is patterned into circuit regions 36 and 38 composed of GaAs and associated III-V compounds. A cap layer 40 of GaAs is deposited on the circuit layer 34. A Pd layer 42 is deposited either on the cap layer 40 or on a Si substrate 44. The GaAs substrate 30 is then pressed against the Si substrate 44 with the cap layer 40 facing the Si substrate 44 and the Pd layer 42 in between, thereby welding together the GaAs and Si substrates 30 and 44. Then a selective etch removes the GaAs substrate 30 down to the etch-stop layer 32. Another selective etch removes the etch-stop layer 32, thus exposing the GaAs circuit layer 34 bonded to the top of the Si substrate 40. The Si can be processed into Si circuits either before the bonding or, in areas removed from the GaAs circuits, after bonding.

A non-semiconductive substrate can be of almost any material, even if it is not reactive with palladium, but it is preferred that a polycrystalline or amorphous semiconductor can be grown on it. It can be a multi-layer structure in which the layer bordering the palladium is a thin film. The palladium layer can also include multiple layers and other constituents. For example, to bond GaAs to a substrate of $SrTiO_3$, a 500 nm film of polycrystalline GaAs can be grown on the $SrTiO_3$ and thereafter reacted with a 50–100 nm palladium layer. Similar techniques can be used for hybrid circuits involving semiconductors together with high-$T_c$ superconducting perovskites grown on optimized substrates, such as MgO, $SrTiO_3$, and $LaGaO_3$.

The invention thus allows the bonding of semiconductor layers to nearly arbitrary substrates. At least the bond between the semiconductor and the palladium is extremely strong. The bonding process can occur at moderate temperatures and pressures but survives fairly high subsequent temperatures. Furthermore, the process can be combined with other standard semiconductor fabrication processes.

What is claimed is:

1. A method of bonding two bodies, comprising the steps of:
   depositing a planar layer comprising palladium on a first surface portion of a first body; and
   pressing a second surface of a second surface portion of a second body on said planar layer, wherein said second surface and said planar layer are pressed into adjacent contact and wherein at least a first one of said first and second surface portions comprises a semiconductor comprising gallium and arsenic.

2. A method as recited in claim 1, wherein a second one of said first and second bodies comprises silicon.

3. A method of bonding two bodies, comprising the steps of:
   depositing a planar layer comprising palladium on a first surface portion of a first body; and
   pressing a second surface of a second surface portion on a second body on said planar layer, wherein said second surface and said planar layer are pressed into adjacent contact and wherein at least a first one of said first and second surface portions comprises a semiconductor comprising indium and phosphorous.

4. A method of bonding together two bodies, comprising the steps of:
   depositing a planar layer comprising palladium on a first surface of a first body comprising a first semiconductor; and
   pressing a second surface of a second body comprising a second semiconductor on said planar layer,
   a first one of said bodies comprising silicon and a second one of said bodies comprising a compound semiconductor.

5. A method as recited in claim 4, wherein said planar layer immediately contacts said silicon or a native oxide thereof and said compound semiconductor or a native oxide thereof.

6. A method of bonding together two bodies of dissimilar material, at least one of said bodies being a semiconductor, comprising the steps of
   interposing a thin film planar layer of palladium between two opposing surfaces of said bodies, and
   causing the oxides on the surface of said one body that is a semiconductor to disperse and said semiconductor to react with the palladium layer, said causing step comprising
   pressing said two bodies so that the palladium layer is in intimate contact with the semiconductor surface and annealing said two bodies being pressed together at a temperature between 200° and 600° C. to bond the semiconductor surface to the palladium layer.

7. A method in accordance with claim 6 wherein said annealing occurs at a temperature of the order of 200° C.

8. A method in accordance with claim 6 wherein said semiconductor comprises a III-V semiconductor.

9. A method as recited in claim 6, wherein said semiconductor comprises silicon.

10. A method of bonding together two bodies comprising the steps of:
    depositing a thin film planar layer of palladium on a surface of one of said bodies, and
    pressing a surface of the other of said bodies on said planar layer, said other of said bodies comprising a III-V semiconductor, to disperse the oxide of the semiconductor on the surface of said other body and to react with the semiconductor to form a bonding region.

11. A method in accordance with claim 10 further comprising heating said pressed surface of the other of said bodies at an annealing temperature of less than 600° C.

12. A method as recited in claim 10, wherein said pressing step presses said first and second bodies together with a pressure of no more than 15,000 dynes per square millimeter.

* * * * *